Figure 3:
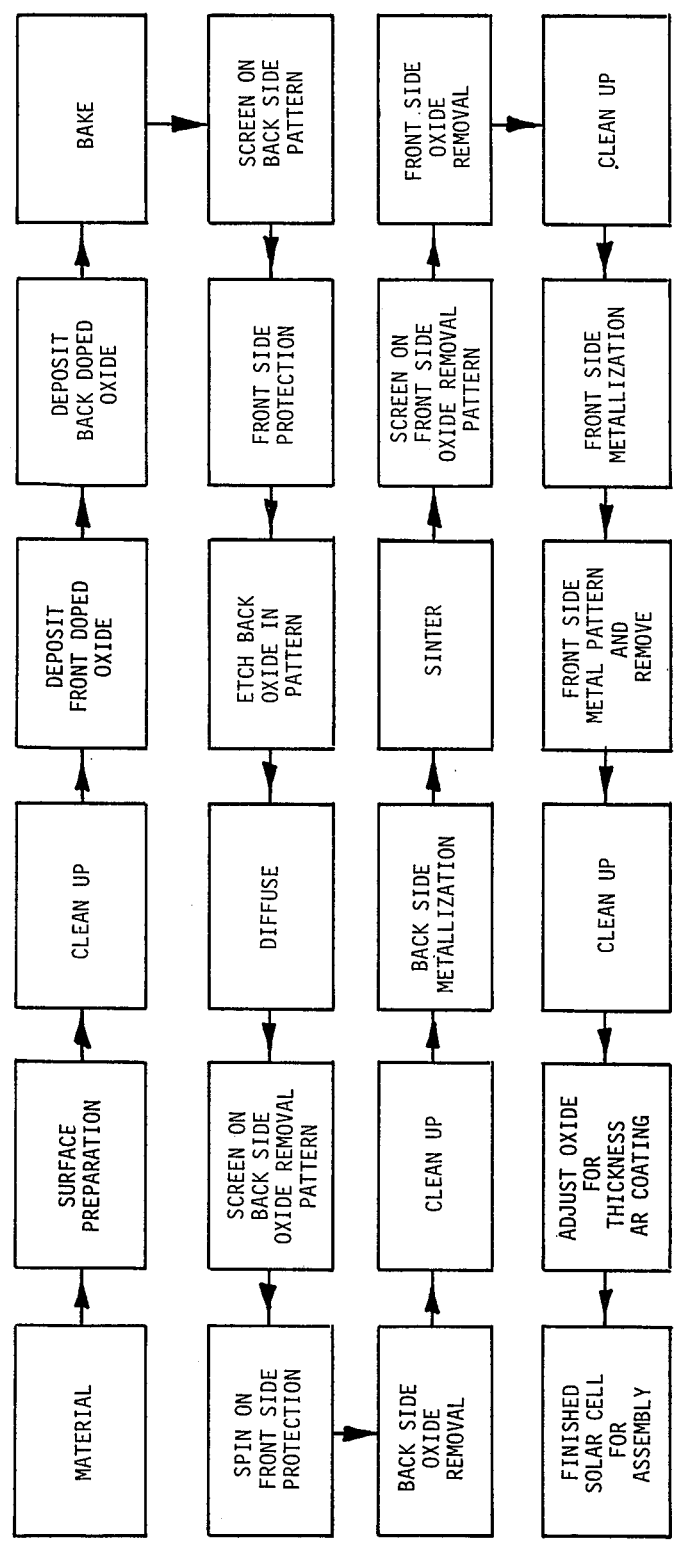

United States Patent [19]

Shah et al.

[11] 4,101,351
[45] Jul. 18, 1978

[54] PROCESS FOR FABRICATING INEXPENSIVE HIGH PERFORMANCE SOLAR CELLS USING DOPED OXIDE JUNCTION AND INSITU ANTI-REFLECTION COATINGS

[75] Inventors: Pradeep L. Shah, Dallas; Clyde R. Fuller, Plano, both of Tex.

[73] Assignee: Texas Instruments Incorporated, Dallas, Tex.

[21] Appl. No.: 742,027

[22] Filed: Nov. 15, 1976

[51] Int. Cl.² .......................................... H01L 21/225
[52] U.S. Cl. .................................. 148/188; 148/187; 136/89 CC; 357/30
[58] Field of Search ..................... 148/188; 357/30; 136/89 CC

[56] References Cited

U.S. PATENT DOCUMENTS

| Re. 28,610 | 11/1975 | Lindmayer | 136/89 CC |
|---|---|---|---|
| 3,359,137 | 12/1967 | Kaye et al. | 136/89 CC |
| 3,361,594 | 1/1968 | Iles et al. | 136/89 CC |
| 3,755,015 | 8/1973 | Redington et al. | 148/188 |
| 3,915,766 | 10/1975 | Pollack | 148/188 |

*Primary Examiner*—T. Ozaki
*Attorney, Agent, or Firm*—James T. Comfort; Gary C. Honeycutt

[57] ABSTRACT

Silicon solar cells may be made from either "P" type substrates with "N" type dopants to form the geometries or with "N" type substrates and "P" type dopants forming the junction. This invention relates to the dopant species employed, the improved method of application and junction formation, formation of insitu anti-reflective coatings, and improved metallization processing for silicon solar cells. The invention does not affect preparation of the silicon substrate prior to diffusion steps, and is applicable both to planar solar cells and to vertical-multijunction cells. This invention discloses an alternate process of junction formation using arsenic as dopant. The process is uniquely different in the fact that it simplifies the number of process steps by using the doped oxide for junction formation, metallization mask and as an anti-reflection surface layer.

1 Claim, 5 Drawing Figures

VERTICAL MULTIJUNCTION SOLAR CELL

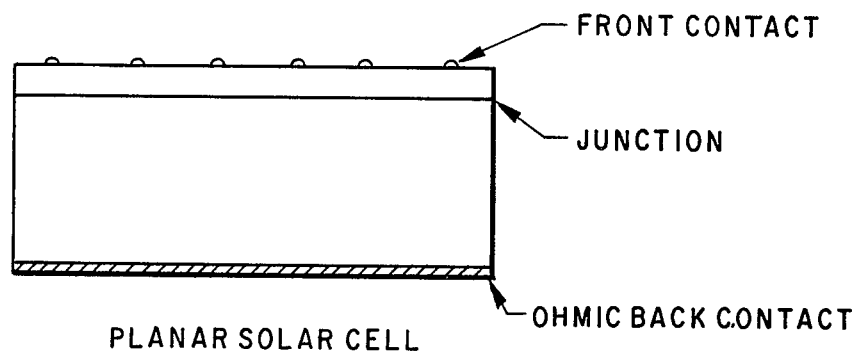
Fig. 1A PLANAR SOLAR CELL
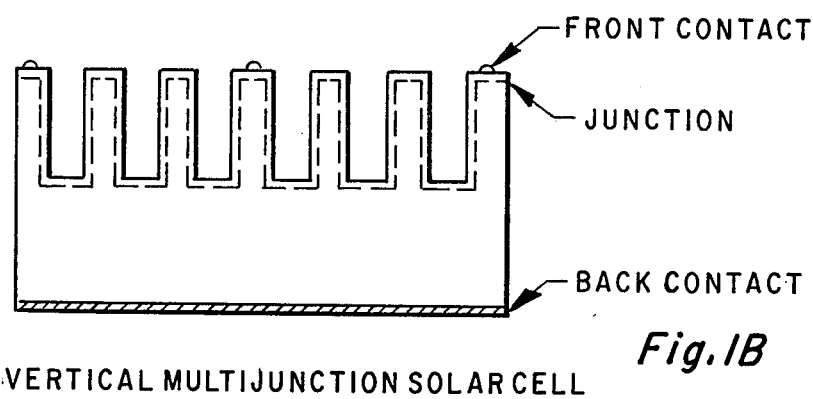
Fig. 1B VERTICAL MULTIJUNCTION SOLAR CELL

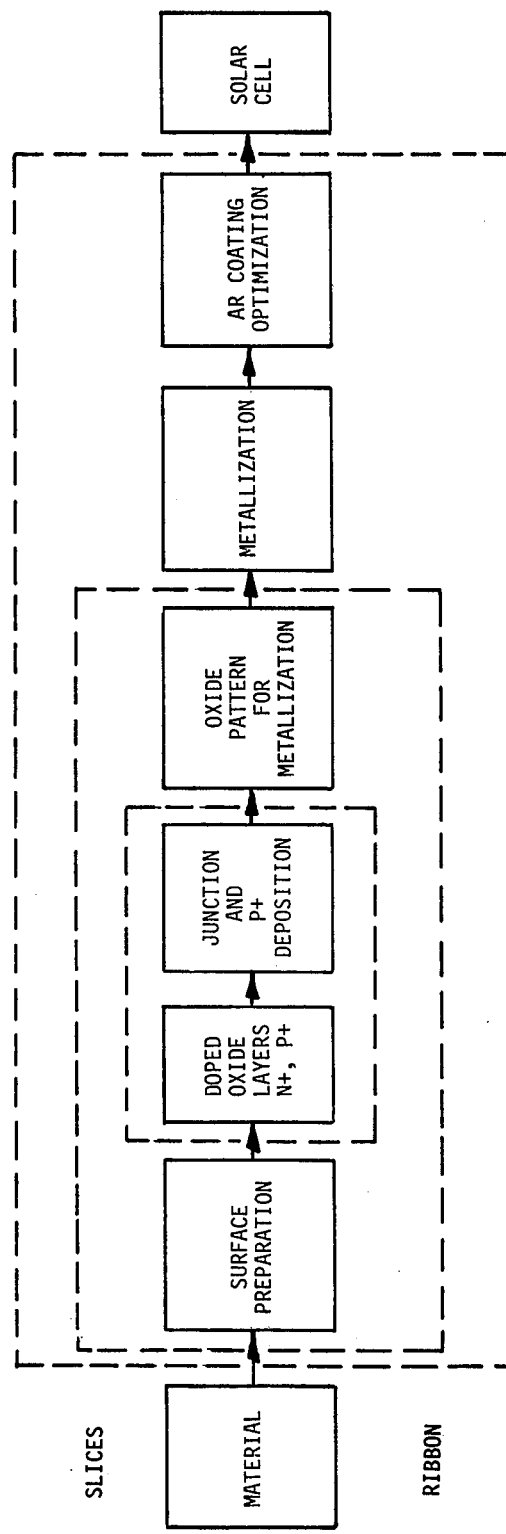

PROCESS FOR FABRICATING INEXPENSIVE HIGH PERFORMANCE SOLAR CELLS USING DOPED OXIDE JUNCTION AND INSITU ANTI-REFLECTION COATINGS

This invention relates to silicon photo-voltaic devices, particularly those which convert solar radiation energy, commonly called solar cells, to the useful electrical energy, and to a novel process for fabricating these solar cells with controllable diffused junctions, anti-reflective coating, and masking against metal and metal etch process degradation of photo-voltaic response of these devices.

Until recently, use of the solar cells has been limited to the special applications — namely, to satellite and extra terrestrial application where other sources of energy are not readily available. These devices have had limited application as terrestrial energy sources due to their high cost as compared to the conventional fossil fuels. However, in recent years, these devices have received more attention for terrestrial application due to rising costs of the conventional energy. To compete with conventional energy sources, the solar cells with high conversion efficiencies must be fabricated with considerable fabrication simplicity and at considerably lower cost. The proposed invention proposes a scheme to achieve this goal.

A silicon solar cell basically consists of a thin silicon slice having a single large area of shallow junctions covering the side of the slice facing the light source. The photo-excited charge carriers flow to frontside metal contact of geometry such that near optimum charge collection is accomplished with minimum of metal area shielding the cell surface from light on the front side of the cell, and to an ohmic contact, covering most of the cell area of the backside of the cell.

Silicon solar cells may be made from either "P" type substrates with "N" type dopants to form the geometries or with "N" type substrates and "P" type dopants forming the junction.

This invention relates to the dopant species employed, the improved method of application and junction formation, formation of in situ anti-reflective coatings, and improved metallization processing for silicon solar cells. The invention does not impact preparation of the silicon substrate prior to diffusion steps, and is applicable both to planar solar cells and to vertical-multijunction cells. Therefore, our discussion of prior art and processing techniques employed by this invention will be confined to those steps following substrate preparation for dopant deposition and diffusion processing for junction formations.

Solar cell junctions have typically been formed by gas phase deposition of the dopant material onto the surface of the cell substrate. Conditions have been such that little silicon dioxide is formed during processing, and dopant dissolved in the device surface has become the diffusion source for junction formation. For N on P junctions, phosphorus has been the most common dopant material while boron has been used for P on N type cells. Aluminum backside contacts have been often diffused or alloyed through the N junction. For "P" on "N" cells, the backside junction had to be removed or else prevented from forming by oxidizing the silicon slice prior to diffusion and then removing selectively only the oxide from the cell front. The backside oxide prevented junction formation by masking the silicon surface from the deposited dopant.

Following careful junction formation processing designed to preserve high carrier lifetimes, low leakages, and uniform, shallow junctions, electrical contact had to be made to the cell in such a way as to provide maximum carrier collection efficiency, minimum series resistance (both in terms of contact and metallization resistances), and minimum coverage of the illuminate cell surface.

Low contact resistance to the frontside of the solar cell with its high dopant concentrations is relatively easy. Backside contact is more difficult since processing steps do not ordinarily provide high doping concentrations on this side of the cell.

Typically, the thin oxides grown during junction formation are removed by exposing the cell to HF or buffered HF solutions. If "N" on "P" shallow junctions are employed for cell production, aluminum backside contact may be made either by removing the backside junction through chemical or physical means, depositing and alloying in the aluminum; or, alternatively, the aluminum may be alloyed through the shallow backside junction, to form a P+ layer through auto-doping of the P material.

Where "P" on "N" junctions are used, the backside junction must be prevented from forming or else subsequently removed. Aluminum will not make ohmic contact with low resistivity "N" type material. A metal system providing some N doping or a backside N+ layer must be deposited. The former is the simpler alternative. Electroless Ni, containing up to 12% phosphorus, will make satisfactory contact to low resistivity silicon with proper slice pre-treatment and sintering. This metal is then covered over by an additional metal system to permit assembly of the cell into arrays.

Making ohmic contact to the high surface concentration frontside of the solar cell may be accomplished with a variety of metals, protecting the properties of the shallow junction and sensitive device surface from metallization processing related degradation is a difficult problem. In the prior art, typically a multi-metal system involving a barrier-adhesion layer and a conductor layer are employed. Some typical systems are Ti-Pd-Ag, Ti-Cu, Cr-Cu, and Ti-Al. Because deposition processes and selective removal of these metals from the front surface, degrades device surfaces with consequent degradation of cell characteristics, conventional processes employ metal masks such that metal is deposited only in contact-carrier collection geometries. Frequently, design of the contact geometry requires two separate depositions to provide continuous metallization. Time delays involved in aligning and applying metal mask often result in native oxide films requiring sintering to produce good contact. Such operations are inherently dangerous to yield in that sintering to overcome the oxide barrier, which will be non-uniform, will endanger shallow junctions.

Need for anti-reflection coating arises for solar cells from the fact that significant amount of incident light is reflected back and not coupled in to semiconductor due to the mismatch in index of refraction of air and solar cell semiconductor. The loss of light is dependent on the indices of refraction and a function of wavelength, e.g., for silicon 34% of long wavelength and 54% short wavelength radiation is lost due to reflection. Anti-reflection coating achieves the effect of matching indices of refraction similar to resistance matching networks used in microwave transmission lines.

An ideal anti-reflective coating would be one that would change the index of refraction gradually from that of air to that of semiconductor for all wavelengths of interest. The closest one comes to in real practice is a multilayer coating that may be matched very well at one wavelength. As many as 20-30 layers may be required from reducing the reflection to <0.1% for single wavelength. For a single layer coating the matter can be considerably simplified by adjusting the thickness of λ/4 for the wavelength of interest. The reflectivity then is minimum at that wavelength, increasing at lower and higher wavelengths. Materials such as SiO, $SiO_2$, $TiO_2$, and $Ta_2O_5$ have been applied with evaporation, sputtering and spin on technique. In practice, in the prior art, the anti-reflective coating is applied to the cell over glass which is in turn glued to the cell with a non-darkening adhesive.

This invention discloses an alternate process of junction formation using arsenic for example as dopant. The process is uniquely different in the fact that it simplifies the number of process steps by using the doped oxide for junction formation, then as a metallization mask, and then as an antireflection surface layer. The process has the following advantages over the conventional process.

The deposited dopant layer, either vapor deposited or spun on polymer doped oxide, acts as dopant source for junction formation.

The technique can be used to form N+ and P+ layers simultaneously by deposition or spin on application of N and P doped oxides on each side of the cell. This will result in a N+PP+, or P+NN+ structure depending on N or P type substrate used. These structures are more desirable from the solar cell performance since they allow simpler metal systems and yield higher efficiencies through improved open circuit voltages.

The doped glasses or polymer oxide layers lend themselves to the use of arsenic as a dopant in addition to boron or phosphorus. Arsenic is known to have better lattice match to silicon as compared to phosphorous as is obvious from the atomic radii of silicon, arsenic and phosphorous 1.176, 1.18 and 1.07 A respectively. Arsenic is also mostly substitutional and diffuses more controllably as compared to phosphorus which is known to diffuse with an anomalous diffusion constant especially at lower temperatures forming tails and kinks in the impurity distributions. Phosphorus top layer deposited at high temperature is known to yield in a "dead" layer due to high concentration of electrically inactive phosphorus. This dead layer causes drastic photo-response degradation. Use of arsenic alleviates all these difficulties. Doped oxides and polymer based dopants allow such arsenic junction formations without need for using toxic arsenic compounds.

The doped glass or oxide can be selectively patterned to expose the silicon surface for subsequent metallization step. The oxide or the glass over the rest of the active area will protect the silicon surface during contact formation preventing degradation from metal removal or metal removal etching.

Since the doped oxides have an index of refraction intermediate to that of air and silicon, the thickness of the oxide can be adjusted to form a single layer anti-reflection coating. This anti-reflection coating will be "in situ" and is obtained without use of expensive evaporation techniques.

The top layer is deposited and formed on the clean starting silicon in the beginning of the process. This layer protects the surface throughout the subsequent operations preserving high life times and surface recombination velocity — the two most important solar cell parameters required for efficient collection of photoexcited carriers.

This process eliminates or minimizes the expensive photolithographic and vacuum process steps. With a protective patterned oxide in front the metallization can be achieved by simple, high throughput-nonvacuum process such as electroless metal deposition technique.

The protective oxide can alternately be formed by anodic oxidation which can be used as AR coating and protective mask for metallization. This can be used on a diffused junction formed either by doped oxide or conventional vapor phase technique. This technique can be then used in conjunction with phosphorus for vacuumless metallization and in situ AR coating.

A typical silicon solar cell is illustrated by FIG. 1A. CVD oxide and anodic oxide techniques are also adaptable to more complicated solar cell structures such as vertical multi-junction solar cells as illustrated by FIG. 1B.

The solar cells and the metal pattern geometries are such that inexpensive high throughput screen on or stamped patterning technique could be used for patterning front oxide for subsequent metallization.

If simple patterning technique is introduced with electroless or PEMDEP metallization the entire solar cell fabrication process as shown in FIG. 2 from material to the finished assembled solar cells can be automated for inexpensive high volume process.

A typical process for inexpensive solar cell production is shown in FIG. 3.

Figure 4:
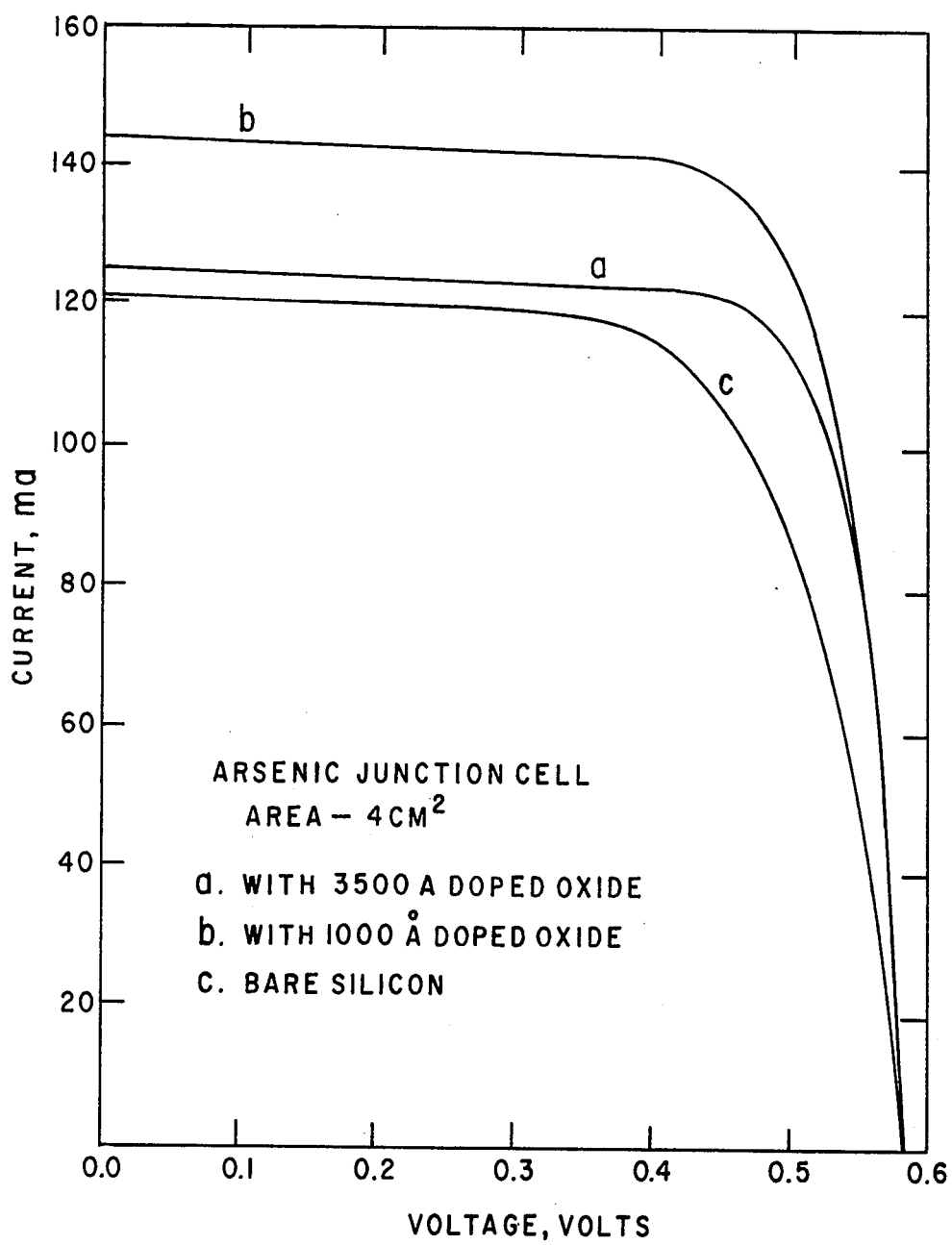

FIG. 4 illustrates the voltage-current relationship achieved by devices fabricated in accordance with the invention.

An example of an oxide-forming dopant-source composition is found in U.S. Pat. No. 3,837,873 issued Sept. 24, 1974 to Pollack et al. The complete disclosure of said patent is incorporated herein by reference.

EXPERIMENTAL RESULTS

Planar n+ −p solar cells fabricated with arsenic dopants were evaluated using a test structure which consists of conventional square geometries with 0.25, 1.0 and 4 $cm^2$ area cells and an array of small circular devices with varied area and area to perimeter ratios. Metal pattern for square cells is a conventional comb structure. The starting material was <111> 3-5Ω/cm p type silicon. A grown oxide was patterned to define the active solar cell areas and followed by CVD deposition of the arsenic doped oxide. Surface concentration was ~$2\times10^{20}$/$cm^3$. Junctions were diffused at 1000° C for durations to achieve 800 - 1500 Å junction depths. Aluminum sintered at 590° C was used on back contact with p+ layer. The oxide was patterned for the front contact metallization of vacuum deposited Ti-Pd-Ag. Phosphorus gettering for improving bulk majority carrier times was used on part of the slices.

Electrical characterization and photoresponse were measured before and after front metallization. Open circuit voltages were 0.58 - 0.595 for gettered devices and 0.56 - 0.575 on ungettered devices and fill factors are 0.77 - 0.79. A typical I-V characteristic is shown for a device with different front oxide thickness in FIG. 4. To compare to an ideal antireflection coating a corrective factor of 1.4 over bare silicon response was used to obtain a current of 40 ma/cm². The arsenic doped $SiO_2$ in situ antireflection coating shows 20–30% increase in the photoresponse over bare silicon. Spectral measurements indicate that the photoresponse in the shorter wavelength region for these cells is smaller than for ultra violet cells, suggested marginal spectral matching of the present technique, and with the state of the art antireflection layers 1.4 enhancement factors can indeed the achieved to yield 40–45 ma/cm² short circuit currents.

The cells fabricated are simple n+-p structures with a back p+ layer obtained by sintered aluminum. The open circuit voltages of 0.59 are higher than the predicted maximum values for the 3–5Ω/cm base resistivity. Further improvements in the photoresponse and overall efficiency are expected by surface texturing techniques and more effective back surface field regions.

Spin on polymer doped with arsenic have been used to fabricate large area (>35 cm²) solar cells. Short circuit currents of 25–30 ma/cm² with an in situ antireflection coating have been achieved.

What is claimed is:

1. A process for the fabrication of a solar cell comprising the steps of:
   (a) applying a silicon oxide-forming, arsenic-comprising, dopant source composition to a monocrystalline silicon body of p-type conductivity, said dopant source comprising a solution of an arsenic-doped reaction product obtained by refluxing tetraethylorthosilicate with acetic anhydride or acetic acid;
   (b) heating the resulting composite to a diffusion temperature for a time sufficient to diffuse said arsenic dopant into the silicon body, thereby forming a p-n junction,
   (c) selectively patterning the remaining doped silicon oxide source layer to provide apertures therein for metallization of the diffused region;
   (d) depositing and patterning a metal film on said patterned dopant source layer, whereby said dopant source layer is retained as an anti-reflection coating.

* * * * *